United States Patent
Sameshima et al.

(10) Patent No.: US 9,112,504 B2
(45) Date of Patent: Aug. 18, 2015

(54) HIGH FREQUENCY SWITCH

(75) Inventors: Fuminori Sameshima, Tokyo (JP); Masahiko Kohama, Tokyo (JP); Takuo Morimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/117,170

(22) PCT Filed: May 23, 2012

(86) PCT No.: PCT/JP2012/063131
§ 371 (c)(1),
(2), (4) Date: Nov. 12, 2013

(87) PCT Pub. No.: WO2012/165241
PCT Pub. Date: Dec. 6, 2012

(65) Prior Publication Data
US 2014/0124908 A1    May 8, 2014

(30) Foreign Application Priority Data

May 27, 2011    (JP) ................................ 2011-119379

(51) Int. Cl.
*H03K 17/74*    (2006.01)
*H01P 1/15*    (2006.01)
(Continued)

(52) U.S. Cl.
CPC *H03K 17/74* (2013.01); *H01P 1/15* (2013.01); *H04B 1/48* (2013.01); *H03K 17/76* (2013.01)

(58) Field of Classification Search
CPC ...... H03D 7/1408; H03D 7/02; H03D 9/0633
USPC ............................ 455/330, 323, 326; 333/235
See application file for complete search history.

(56) References Cited

U.S. PATENT DOCUMENTS 4,320,536 A * 3/1982 Dietrich ......................... 455/325
6,449,471 B1 * 9/2002 Katsura et al. ................. 455/324
(Continued)

FOREIGN PATENT DOCUMENTS

CN    102171927 A    8/2011
JP    58 88423    6/1983
(Continued)

OTHER PUBLICATIONS

International Search Report Issued Aug. 28, 2012 in PCT/JP12/063131 Filed May 23, 2012.
(Continued)

*Primary Examiner* — Thomas L Dickey
(74) *Attorney, Agent, or Firm* — Oblon, McClelland, Maier & Neustadt, L.L.P.

(57) ABSTRACT

A compact high frequency switch needing no external control signal is obtained. The high frequency switch includes an anti-parallel diode (first anti-parallel diode) having one end and another end coupled with an antenna terminal (first high-frequency-signal input/output terminal) and a transmitting terminal (second high-frequency-signal input/output terminal), respectively, and becoming a conduction state in the input power not less than predetermined high frequency power. When the high frequency switch is an SPDT type, such a switch may include a ¼-wavelength line in the use frequency of the high frequency switch having one end and another end coupled with the antenna terminal and a receiving terminal (third high-frequency-signal input/output terminal), respectively, and an anti-parallel diode (second anti-parallel diode) coupled between the receiving terminal and a ground and becoming a conduction state in the input power not less than predetermined high frequency power.

12 Claims, 12 Drawing Sheets

(51) Int. Cl.
   *H04B 1/48*    (2006.01)
   *H03K 17/76*   (2006.01)

(56) References Cited

U.S. PATENT DOCUMENTS

| 7,054,610 | B1* | 5/2006 | Itoh et al. ...................... 455/324 |
| 2005/0206571 | A1 | 9/2005 | Takenaka |
| 2006/0197577 | A1* | 9/2006 | Mukherjee et al. ........... 327/317 |
| 2007/0252666 | A1 | 11/2007 | Shtrom |
| 2008/0100395 | A1 | 5/2008 | Oikawa et al. |

FOREIGN PATENT DOCUMENTS

| JP | 59 186434 | 10/1984 |
| JP | 62 230115 | 10/1987 |
| JP | 63 43412 | 2/1988 |
| JP | 2 90554 | 7/1990 |
| JP | 2-103285 U | 8/1990 |
| JP | 2005 269129 | 9/2005 |
| JP | 2007 150935 | 6/2007 |
| JP | 2007 221314 | 8/2007 |
| JP | 2008 109535 | 5/2008 |
| JP | 4367423 | 9/2009 |

OTHER PUBLICATIONS

Combined Chinese Office Action and Search Report issued Aug. 21, 2014 in Paten Application No. 201280025584.7 (with English Translation and English Translation of Category of Cited Documents).

Office Action issued Nov. 4, 2014 in Japanese Patent Application No. 2011-119379 (with English translation).

Australian Office Action issued Feb. 10, 2015 in Patent Application No. 2012263691 (4 pages).

* cited by examiner

HIGH FREQUENCY SWITCH

TECHNICAL FIELD

The present invention relates to a high frequency switch which is utilized for a high frequency circuit like a transmitter/receiver module, and which switches the path of high frequency signals.

BACKGROUND ART

In order to transmit a transmission signal and to receive a receiver signal through the common antenna, a transmitter/receiver module has a high frequency switch which is coupled with the antenna and which switches the circuit in such a way that a transmitter is coupled with the antenna at the time of transmitting and a receiver is coupled with the antenna at the time of receiving.

For example, Patent Literature 1 discloses a high frequency switch circuit that connects a capacitor in parallel with a transmission line in the switch circuit. According to the high frequency switch circuit of Patent Literature 1, there is an explanation that an isolation of equal to or greater than 35 dB is ensured even in a band where a transmitting frequency band and a receiving frequency band partially overlap with each other.

Patent Literature 2 discloses a high frequency switch using an SPST (Single Pole, Single Throw) switch. The high frequency switch of Patent Literature 2 couples in a cascade manner a variable phase shifter that is capable of setting 0 degree or a phase difference of ±90 degrees in a 90-degree hybrid coupler relative to the SPST switch. The 90-degree hybrid coupler is coupled with an output terminal of the variable phase shifter. The phase level at the variable phase shifter is controlled in accordance with the on/off state of the SPST switch, thereby causing a high frequency signal input from an input terminal 1 to be output through either one of an output terminal 2 and an output terminal 3.

It is conventionally well-known that, as a typical circuit configuration, anti-parallel diodes are utilized as a limiter circuit (see, for example, Patent Literature 3 or 4). Moreover, Patent Literature 5 discloses the use of a limiter diode as a switching element.

CITATION LIST

Patent Literature

Patent Literature 1: Unexamined Japanese Patent Application Kokai Publication No. 2008-109535
Patent Literature 2: Unexamined Japanese Patent Application Kokai Publication No. 2007-221314
Patent Literature 3: Unexamined Japanese Utility Model Application Kokai Publication No. S58-88423
Patent Literature 4: Unexamined Japanese Patent Application Kokai Publication No. 2007-150935
Patent Literature 5: Unexamined Japanese Utility Model Application Kokai Publication No. H02-90554

SUMMARY OF INVENTION

Technical Problem

The high frequency switch disclosed in Patent Literature 1 or Patent Literature 2 needs an external control signal, and also needs a control circuit to generate such an external control signal. In particular, when the high frequency switch is switched at a fast speed or when the high frequency switch is driven at a high voltage, a complex control circuit is necessary. Hence, conventional high frequency switches have a disadvantage that the circuit scale of the control circuit that is a peripheral circuit becomes large.

The present invention has been made in order to address the above-explained disadvantage, and it is an objective of the present invention to provide a compact high frequency switch that needs no external control signal.

Solution to Problem

A high frequency switch according to the present invention includes a first anti-parallel diode which has one end coupled with a first high-frequency-signal input/output terminal, has another end coupled with a second high-frequency-signal input/output terminal, and becomes a conduction state when input power of equal to or greater than predetermined high frequency power is input.

Advantageous Effects of Invention

According to the present invention, the switching operation of a high frequency switch is performed through an on/off operation of anti-parallel diodes based on input high frequency power, and thus a compact high frequency switch can be obtained that needs no control circuit which generates a switching signal.

BRIEF DESCRIPTION OF DRAWINGS

FIG. 2A is an equivalent circuit diagram illustrating a high frequency switch when a high frequency signal of large-signal power passes through;

FIG. 2B is an equivalent circuit diagram illustrating a high frequency switch when a high frequency signal of small-signal power passes through;

DESCRIPTION OF EMBODIMENTS

First Embodiment

Figure 1:
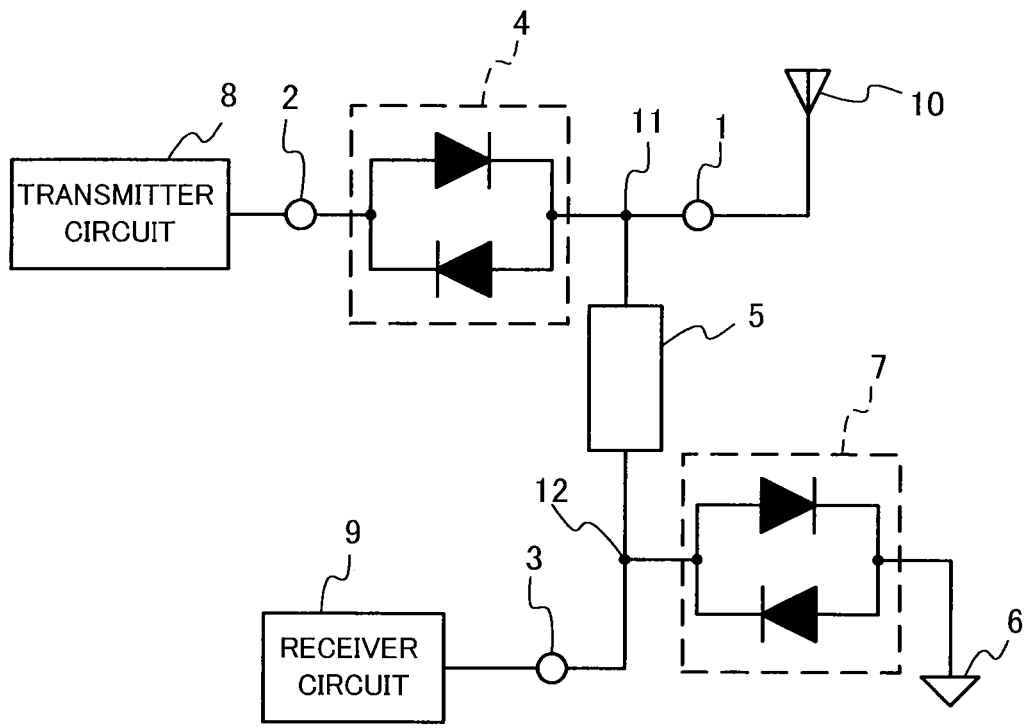
FIG. 1 is a circuit diagram illustrating a high frequency switch of an SPDT type according to a first embodiment of the present invention.

An explanation will be given of a first embodiment of the present invention with reference to FIG. 1. FIG. 1 is a circuit diagram illustrating a high frequency switch of an SPDT (Single Pole, Dual Trow) type that changes the circuit to be coupled with an antenna between a transmission circuit and a receiver circuit. The high frequency switch includes an anti-parallel diode 4 (first anti-parallel diode), a ¼-wavelength line 5 (first ¼-wavelength line), and an anti-parallel diode 7 (second anti-parallel diode). The high frequency switch has an antenna terminal 1 (first high-frequency-wave input/output terminal) coupled with an antenna 10, a transmitting terminal 2 (second high-frequency-wave input/output terminal) coupled with a transmitter circuit 8, and a receiving terminal 3 (third high-frequency-wave input/output terminal) coupled with a receiver circuit 9.

The anti-parallel diode 4 includes two PIN diodes (P-Intrinsic-N diodes) coupled in parallel with each other in such a way that respective anodes and cathodes are directed in opposite directions. The anti-parallel diode 4 is coupled with the antenna terminal 1 and the transmitting terminal 2. The ¼-wavelength line 5 is coupled with a branched point 11 of the anti-parallel diode 4 at the antenna-terminal-1 side, and the receiving terminal 3. The ¼-wavelength line 5 has a transmission length by what corresponds to the use frequency of the high frequency switch, that is, ¼ wavelength of a high frequency signal passing through the high frequency switch. Hence, a phase difference of $\pi/2$ of the use frequency is caused at both ends of the ¼-wavelength line 5.

The anti-parallel diode 7 includes two PIN diodes (p-intrinsic-n Diode) connected in parallel with each other in such a way that respective anodes and cathodes are directed in opposite directions. The anti-parallel diode 7 is coupled with a connection point 12 of the ¼-wavelength line 5 at the receiving-terminal-3 side. The anti-parallel diode 7 has one end coupled with a ground 6 of the circuit. The ground 6 is an equipotential point that gives a potential to be the reference of the circuit.

High frequency signals output by the transmitter circuit 8 pass through the anti-parallel diode 4 via the transmitting terminal 2, and are output to the antenna 10 coupled with the antenna terminal 1. Moreover, the high frequency signals received by the antenna 10 pass through the ¼-wavelength line 5 from the branched point 11 between the transmitter-circuit-8 side and the receiver-circuit-9 side, and are input to the receiver circuit 9 coupled with the receiving terminal 3. An explanation will now be given of an operation of the high frequency switch in. FIG. 1.

Figure 2A:
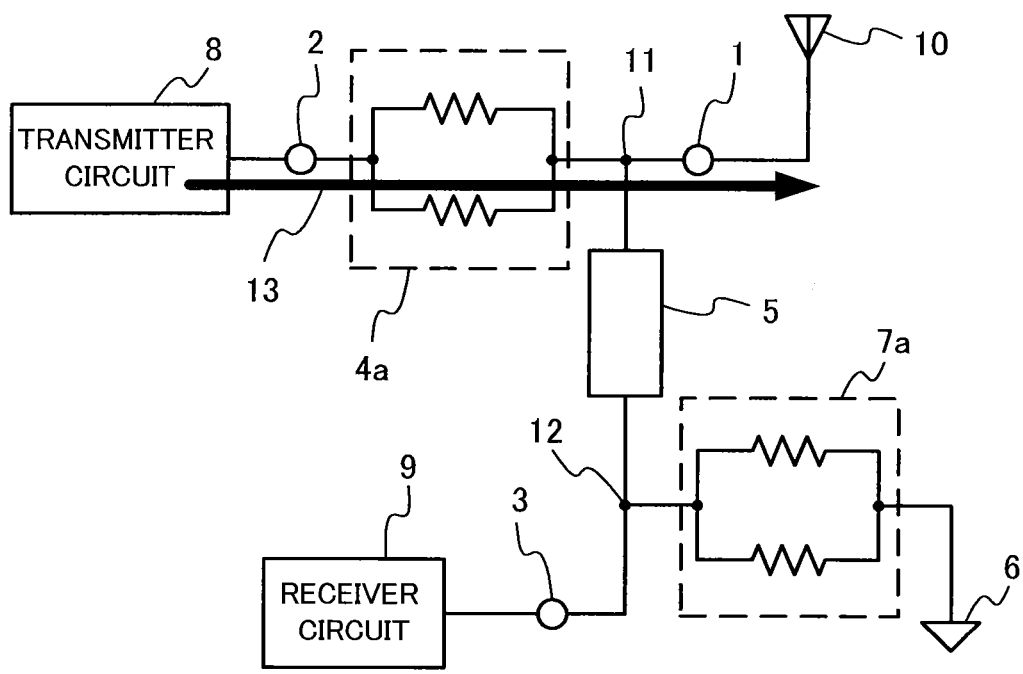

FIG. 2A is an equivalent circuit diagram of the high frequency switch when a high frequency signal of large-signal power passes through. When a high frequency signal of large-signal power passes through, the anti-parallel diodes 4 and 7 can be regarded as parallel resistors 4a and 7a, respectively. The large-signal power is power of equal to or greater than a voltage (forward voltage) that causes a current to rapidly increase in biasing in the forward direction of a diode. Since the two resistors that are parallel resistors 4a and 7a are diodes in practice, those resistors allow a current to flow only in one direction, but since the two diodes in the opposite directions are coupled in parallel, a current is allowed to flow in both directions. As a result, a transmitting signal flows in a direction indicated by an arrow of a transmitting signal 13.

When a high frequency signal of a large-signal power of equal to or greater than the forward voltage of the PIN diode like 100 mW is input, the anti-parallel diodes 4 and 7 become the on state (conducted state), and are minute resistors from the standpoint of a high frequency. Since the anti-parallel diode 7 can be regarded as minute resistors from the standpoint of a high frequency, the connection point 12 becomes a short-circuit point of the ground 6. The branched point 11 between the transmitter-circuit-8 side and the receiver-circuit-9 side is distant from the connection point 12 that is the short-circuit point by the ¼ wavelength of the wavelength of the frequency of the high frequency signal, and thus the branched point is an open point from the standpoint of a high frequency. As a result, the transmitting signal 13 is not directed to the path at the receiver-circuit-9 side, but is output to the antenna 10.

Figure 2B:
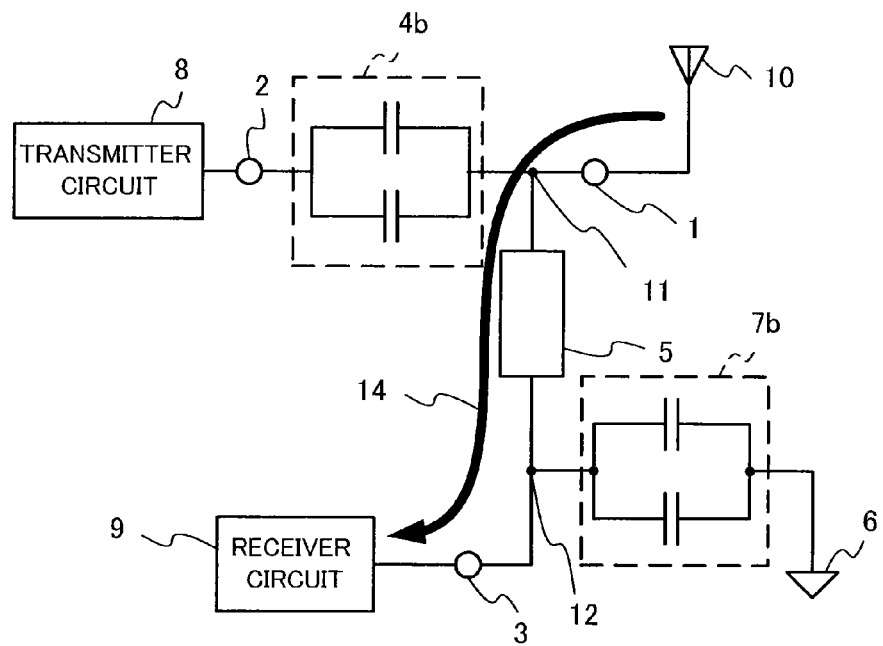

FIG. 2B is an equivalent circuit of the high frequency switch when a high frequency signal of small-signal power passes through. When a high frequency signal of small-signal power passes through, the anti-parallel diodes 4 and 7 can be regarded as parallel capacitors 4b and 7b. The small-signal power is power smaller than a voltage (forward voltage) that rapidly increases a current in biasing in the forward direction of a diode. Moreover, the small-signal power is power equal to or smaller than the (absolute value of) breakdown voltage of the diode. The diode hardly allows a current to flow in both directions within this range. As a result, a receiving signal flows through a path indicated by an arrow of a receiving signal 14.

The anti-parallel diodes 4 and 7 are in an off state (cut-off state) when a high frequency signal of small-signal power like several mW smaller than the forward voltage of the PIN diode is input, can be regarded as the parallel capacitors 4b and 7b from the standpoint of a high frequency, and are in an open state. Since the anti-parallel diodes 4 and 7 can be regarded as the open state from the standpoint of a high frequency, the receiving signal 14 does not pass through the anti-parallel diodes 4 and 7, but is input into the receiver circuit 9.

As explained above, the high frequency switch of the first embodiment automatically changes a signal path depending on the largeness of power of a passing high frequency signal. By configuring the anti-parallel diodes 4 and 7 so as to have diodes selected which have a forward voltage that changes the on/off state when the forward voltage is desired power, a switch can be configured which becomes a conducted state by input power equal to or greater than a predetermined high frequency power.

The anti-parallel diodes 4 and 7 need no external control signal, and thus a complex control circuit, such as a control circuit that switches the high frequency switch at a fast speed, and a control circuit that drives the high frequency switch at a high voltage, becomes unnecessary, thereby contributing to the downsizing. Moreover, according to the structure of the anti-parallel diodes 4 and 7, no high voltage is applied to the PIN diode, and thus a transmitting signal of large power like several hundreds W can pass through the switch with a low loss.

Furthermore, according to the high frequency switch of the first embodiment, the anti-parallel diode 4 causes a high frequency signal of large-signal power to pass through, but blocks a high frequency signal of small-signal power, and thus it becomes possible for the high frequency switch to suppress a leakage of noises of small-signal power to the receiving circuit 9 when noises of the small-signal power other than the transmitting signal by the transmitter circuit 8 occur.

According to the first embodiment, the explanation was given of a case in which a high frequency signal of large-signal power passes through from the transmitting terminal 2 to the antenna terminal 1, and a high frequency signal of small-signal power passes through from the antenna terminal 1 to the receiving terminal 3. When a high frequency signal of large-signal power is input to the antenna terminal 1, the anti-parallel diodes 4 and 7 turn on, and thus the high frequency signal of large-signal power passes through to the transmitting terminal 2. When a high frequency signal of small-signal power is input to the receiving terminal 3, the anti-parallel diodes 4 and 7 turn off, and thus the high frequency signal of small-signal power passes through to the antenna terminal 1. Accordingly, the high frequency switch has a reversible characteristic.

Second Embodiment

Figure 3:
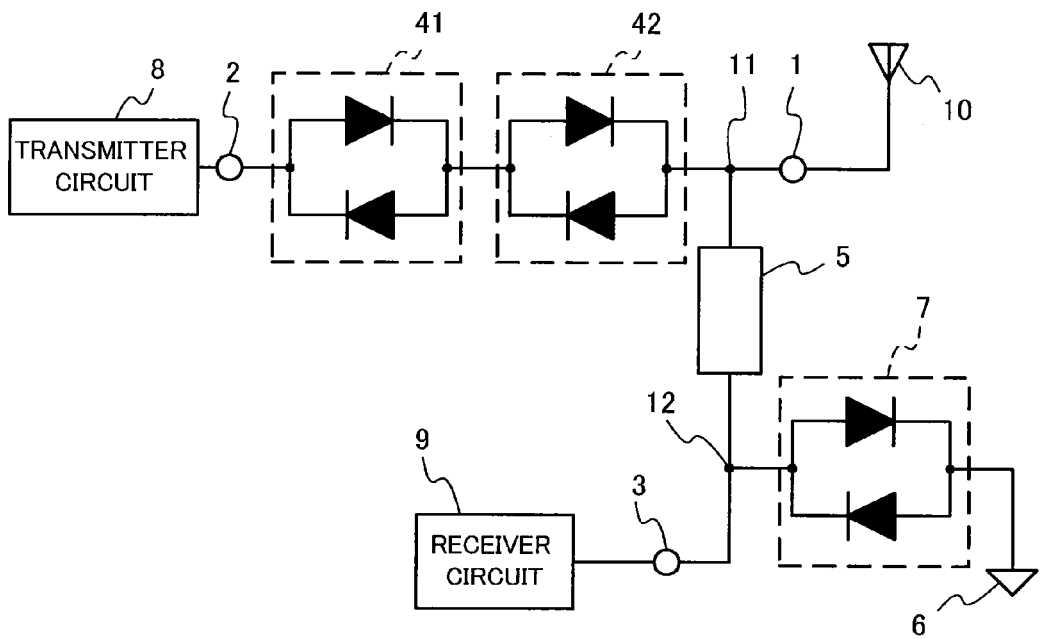
FIG. 3 is a circuit diagram illustrating a high frequency switch according to a second embodiment of the present invention.

According to a second embodiment, the anti-parallel diode 4 between the transmitter circuit 8 and the antenna 10 in the high frequency switch is disposed in a double-stage manner. FIG. 3 is a circuit diagram illustrating a high frequency switch according to the second embodiment of the present invention.

The high frequency switch of the second embodiment employs a structure in which the anti-parallel diode 4 of the first embodiment is replaced with two anti-parallel diodes 41 and 42 connected in series. By connecting in series the anti-parallel diodes 41 and 42 in a double-stage manner, the open state of the anti-parallel diode when a high frequency signal of small-signal power passes through is doubled. As a result, there is an advantage that the isolation level as viewed from the branched point 11 to the transmitter-circuit-8 side becomes large.

According to the second embodiment, the explanation was given of the example case in which the anti-parallel diode 4 at the transmitter-circuit-8 side is disposed as double stages. The high frequency switch of the second embodiment may have the anti-parallel diode 4 in a multiple-stage manner like equal to or greater than three stages. By changing the number of stages of the anti-parallel diode 4, the isolation level as viewed from the branched point 11 between the transmitter-circuit-8 side and the receiver-circuit-9 side to the transmitter-circuit-8 side becomes adjustable when a high frequency signal of small-signal power passes through.

Third Embodiment

According to a third embodiment, in addition to the structure of the second embodiment, a ¼-wavelength line in a wavelength of the use frequency of the high frequency switch is disposed and is connected in series between the two anti-parallel diodes 41 and 42.

Figure 4:
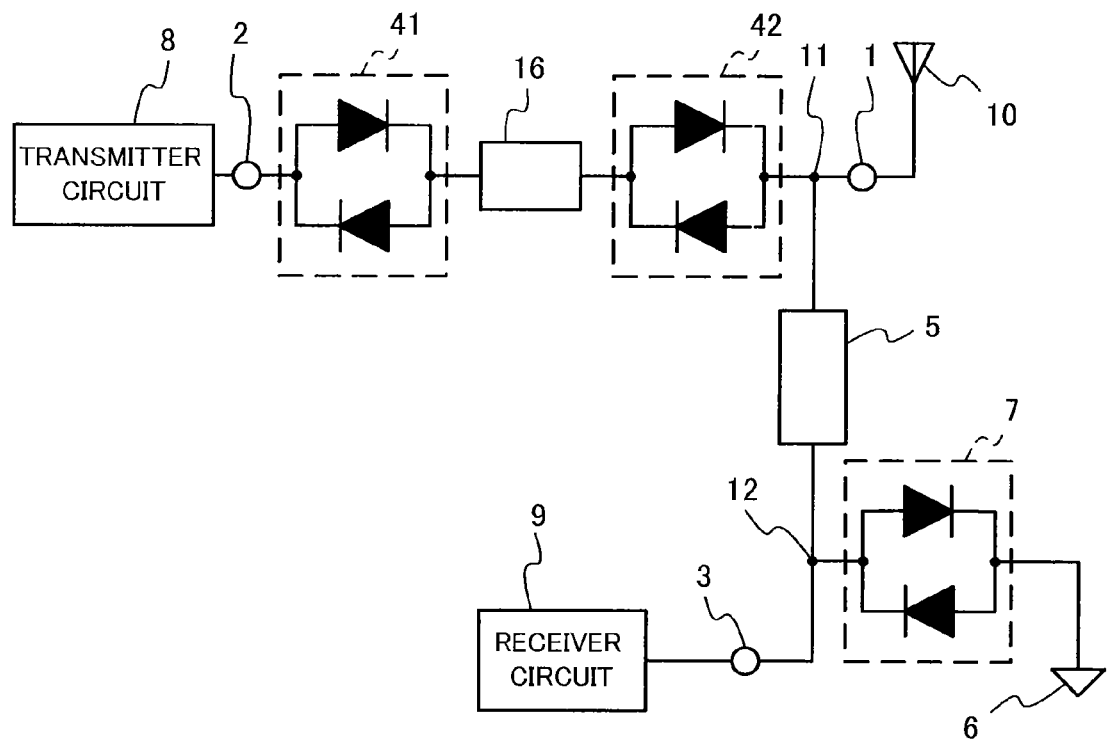
FIG. 4 is a circuit diagram illustrating a high frequency switch according to a third embodiment of the present invention.

FIG. 4 is a circuit diagram illustrating a high frequency switch according to the third embodiment of the present invention. In FIG. 4, the two anti-parallel diodes 41 and 42 are connected together through a ¼-wavelength line 16 (second ¼-wavelength line) of the wavelength of the use frequency of the high frequency switch. In FIG. 4, the same component as that of FIG. 3 will be denoted by the same reference numeral. The structures of the ¼-wavelength line 5, the anti-parallel diode 7, the receiving terminal 3 and the ground 6 are the same as those of the first and second embodiments.

By connecting the anti-parallel diodes 4 in series and in a double-stage manner, the open state of the anti-parallel diode when a high frequency signal of small-signal power passes through becomes doubled. Hence, there is an advantage that the isolation level as viewed from the branched point 11 between the transmitter-circuit-8 side and the receiver-circuit-9 side to the transmitter-circuit-8 side becomes large. Moreover, by providing the ¼-wavelength line 16, the connection point between the anti-parallel diode 41 and the ¼-wavelength line 16 can be regarded as an open point, and thus small-signal power is further suppressed, and the isolation level of small-signal power can be further increased in comparison with that of the second embodiment of the present invention.

According to the third embodiment, the explanation was given of the case in which the anti-parallel diodes 41 and 42 at the transmitter-circuit-8 side employ a double-stage structure. In the third embodiment, the anti-parallel diodes 4 in multiple stages equal to or greater than three stages may be disposed via the ¼-wavelength line 16. By changing the number of stages of the anti-parallel diode 4, the isolation level as viewed from the branched point 11 between the transmitter-circuit-8 side and the receiver-circuit-9 side to the transmitter-circuit-8 side becomes adjustable when a high frequency signal of small-signal power passes through.

Fourth Embodiment

Figure 5:
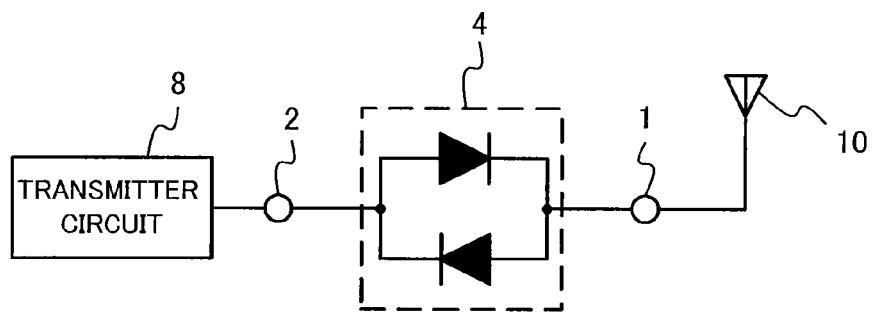
FIG. 5 is a circuit diagram illustrating a high frequency switch of an SPST type according to a fourth embodiment of the present invention.

The first to third embodiments are for the high frequency switches of the SPDT type, but according to a fourth embodiment, an explanation will be given of a case in which the present invention is applied to a high frequency switch of an SPST (Single Pole, Single Throw) type. FIG. 5 is a circuit diagram illustrating a high frequency switch according to the fourth embodiment of the present invention.

As illustrated in FIG. 5, the high frequency switch includes the anti-parallel diode 4 connected in series between the transmitter circuit 8 and the antenna 10. The high frequency switch in FIG. 5 corresponds to the circuit at the transmitter-circuit-8 side in FIG. 1.

The anti-parallel diode 4 can be regarded as, when a high frequency signal of large-signal power output by the transmitter circuit 8 is input, a parallel resistor 4a like the first embodiment. When a high frequency signal of large-signal power like 100 mW that exceeds the forward voltage of the PIN diode is input, the switch becomes an on state, and the anti-parallel diode can be regarded as a minute resistor from the standpoint of a high frequency. Hence, when a high frequency signal of large-signal power is input from the transmitting terminal 2, the antenna terminal 1 and the transmitting terminal 2 become a conducted state, and thus the high frequency signal from the transmitter circuit 8 is transmitted to the antenna 10.

Conversely, when a high frequency signal of small-signal power is input, the anti-parallel diode 4 can be regarded as the parallel capacitor 4b. The anti-parallel diode 4 is in an off state when a high frequency signal of small-signal power like several mW that is smaller than the forward voltage of the PIN diode is input, can be regarded as the parallel capacitor 4b from the standpoint of a high frequency, and is in an open state. As a result, a high frequency signal of small-signal power input from the antenna 10 is prevented from being transmitted to the transmitting terminal 2.

As explained above, the high frequency switch according to the fourth embodiment of the present invention automatically turns on/off depending on the largeness of power of a passing high frequency signal, and is capable of operating as a compact SPST switch that needs no external control signal.

Moreover, the high frequency switch of the fourth embodiment causes the anti-parallel diode 4 not only to permit a high frequency signal of large-signal power to pass through but also to block off a high frequency signal of small-signal power. Accordingly, when noises of small-signal power other than the transmitting signal generated by the transmitter circuit 8 are produced, there is an advantage of preventing the noises of small-signal power from being emitted from the antenna 10. Moreover, like the second and third embodiments, the isolation level of small-signal power is adjustable through a multi-stage structure of the anti-parallel diode 4.

According to the fourth embodiment, the switch has a reversible characteristic of not only on/off operations to a high frequency signal passing through from the transmitting terminal 2 to the antenna terminal 1 but also on/off operations to a high frequency signal passing through from the antenna terminal 1 to the transmitting terminal 2 because of the similar effect.

Fifth Embodiment

Figure 6:
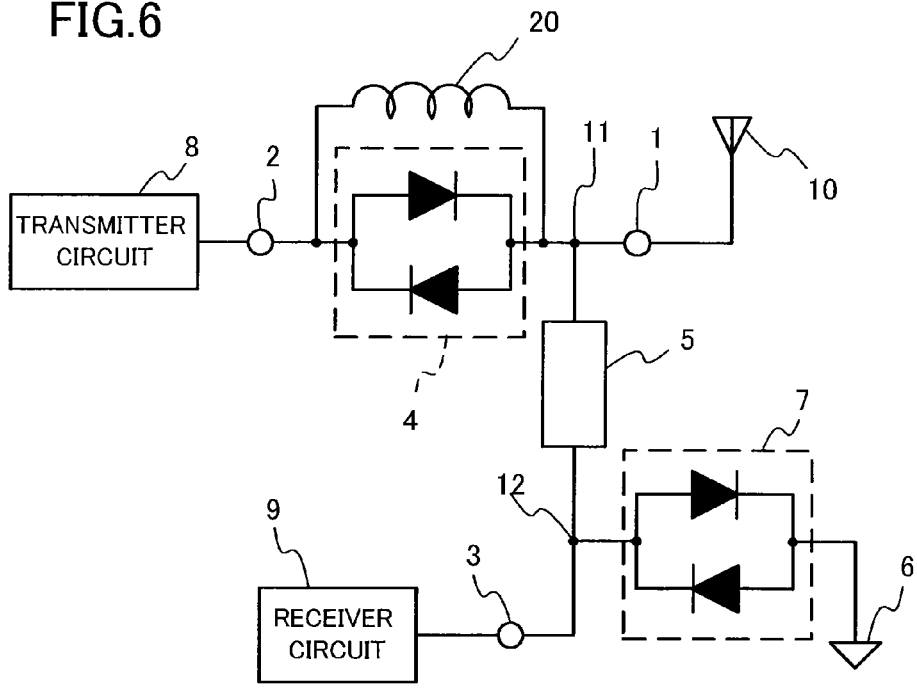
FIG. 6 is a circuit diagram illustrating a high frequency switch according to a fifth embodiment of the present invention.

A high frequency switch according to a fifth embodiment includes an inductance connected in parallel with the anti-parallel diode 4. FIG. 6 is a circuit diagram illustrating a high frequency switch according to the fifth embodiment of the present invention. In FIG. 6, the same component as that of FIG. 1 will be denoted by the same reference numeral.

As illustrated in FIG. 6, the high frequency switch of the fifth embodiment has an inductance 20 (first inductance) connected in parallel with the anti-parallel diode 4. When large-signal power of a high frequency signal from the transmitter circuit 8 decreases, and becomes smaller than the forward voltage of the PIN diode, for example, smaller than 100 mW, the anti-parallel diode 4 becomes an off state, the antenna terminal 1 and the transmitting terminal 2 are disconnected. There is an advantage that a fall time which is a transition time to the disconnected state is reduced by providing the inductance 20. By connecting the inductance 20 in parallel with the anti-parallel diode 4, a high frequency switch that has a short fall time can be obtained without a special control signal.

The impedance of the inductance 20 becomes a high resistance in the frequency of a high frequency signal, and thus a high frequency signal passing through the inductance 20 is ignorable.

Figure 7:
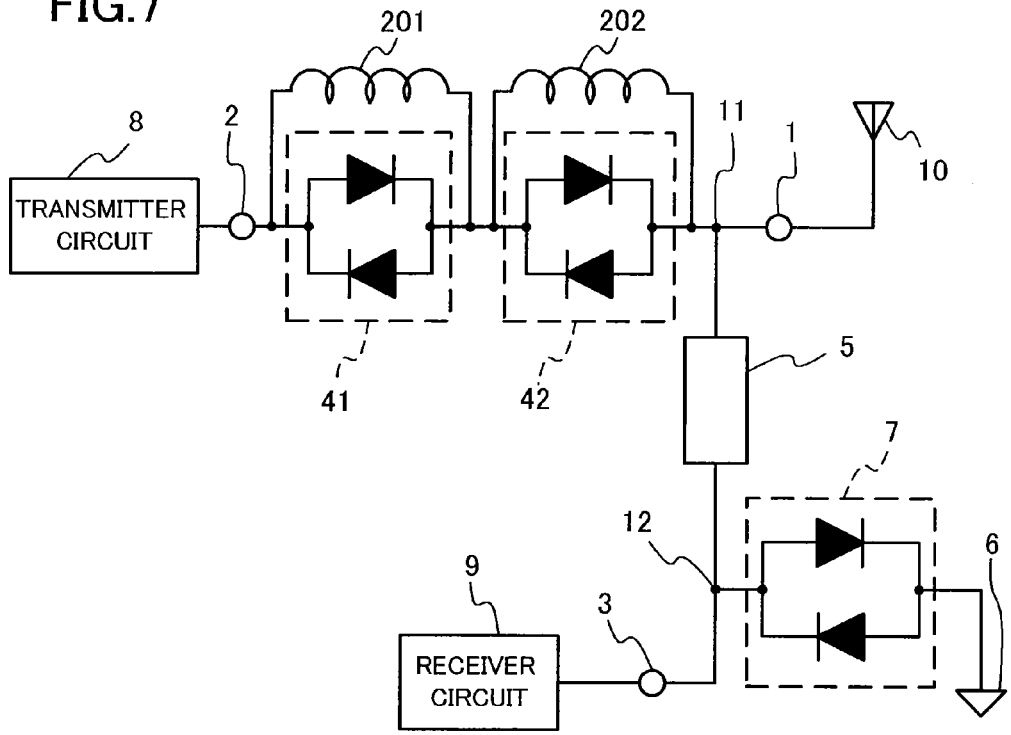
FIG. 7 is a circuit diagram illustrating the high frequency switch of the second embodiment employing the structure of the fifth embodiment.

The same advantage can be obtained when the inductance 20 of the fifth embodiment is added to the high frequency switch of the second to fourth embodiments of the present invention. FIG. 7 is a circuit diagram of the high frequency switch of the second embodiment employing the structure of the fifth embodiment. The high frequency switch in FIG. 7 is the high frequency switch in FIG. 3 that has inductances (first inductances) 201 and 202 connected in parallel with the anti-parallel diodes 41 and 42, respectively.

Figure 8:
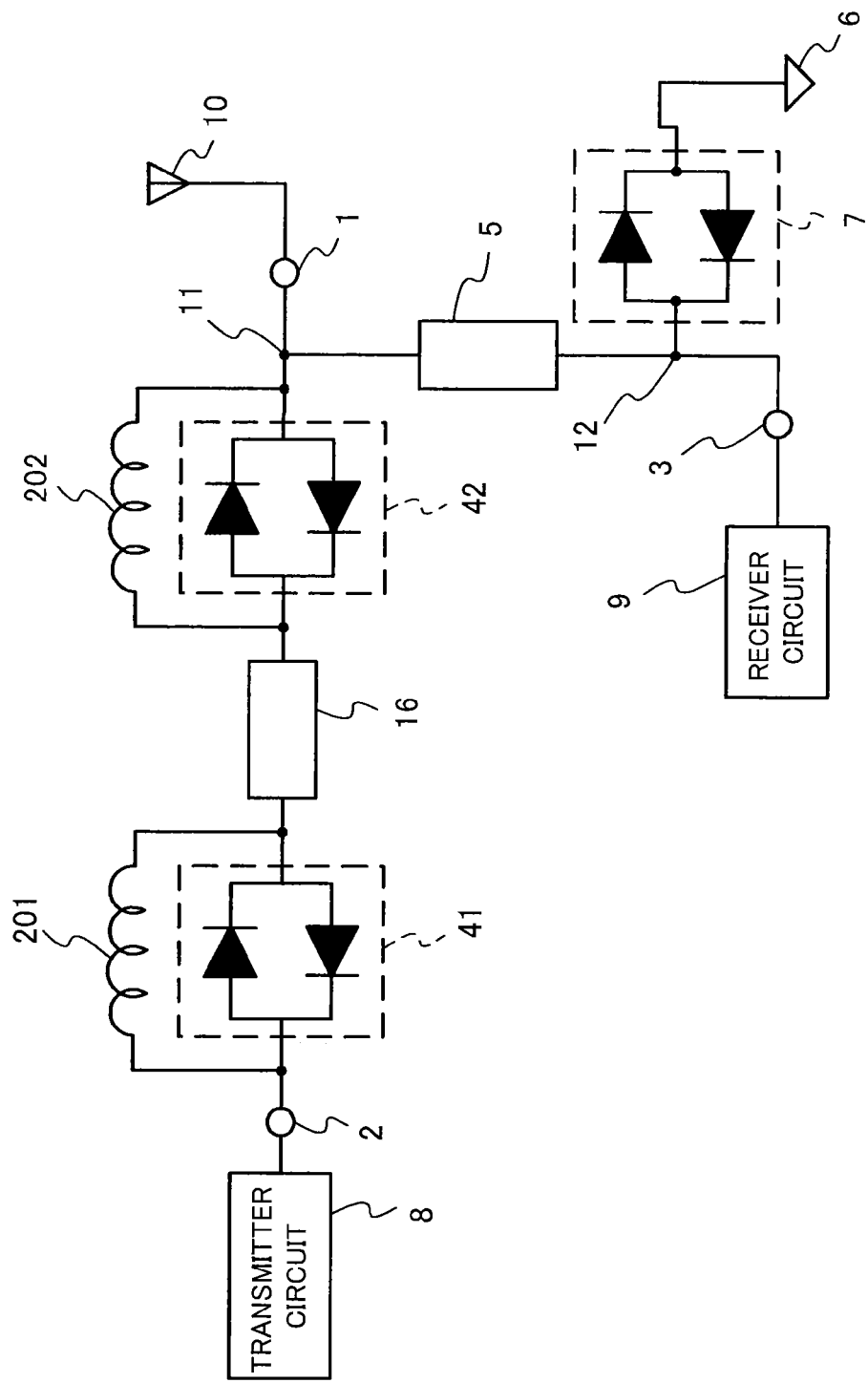
FIG. 8 is a circuit diagram illustrating the high frequency switch of the third embodiment employing the structure of the fifth embodiment.
Figure 9:
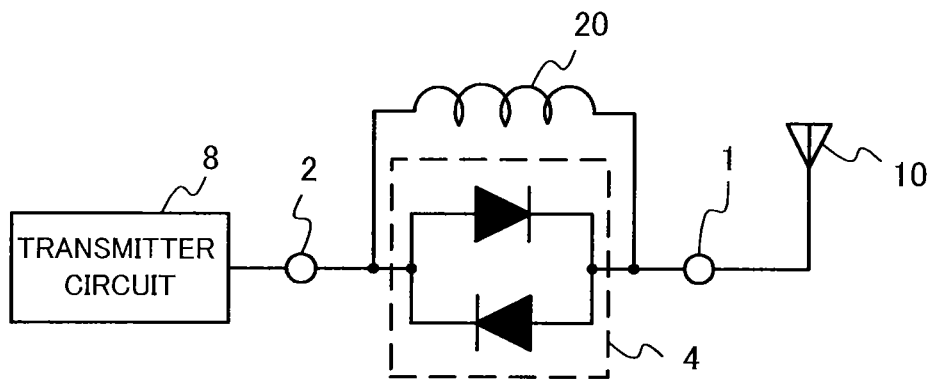
FIG. 9 is a circuit diagram illustrating the high frequency switch of the fourth embodiment employing the structure of the fifth embodiment.

FIG. 8 is a circuit diagram illustrating the high frequency switch of the third embodiment employing the structure of the fifth embodiment. The high frequency switch in FIG. 8 is the high frequency switch in FIG. 4 that has the inductances 201 and 202 connected in parallel with the anti-parallel diodes 41 and 42, respectively. FIG. 9 is a circuit diagram illustrating the high frequency switch of the fourth embodiment employing the structure of the fifth embodiment. The high frequency switch in FIG. 9 is the high frequency switch in FIG. 5 that has the inductance 20 connected in parallel with the anti-parallel diode 4.

Sixth Embodiment

Figure 10:
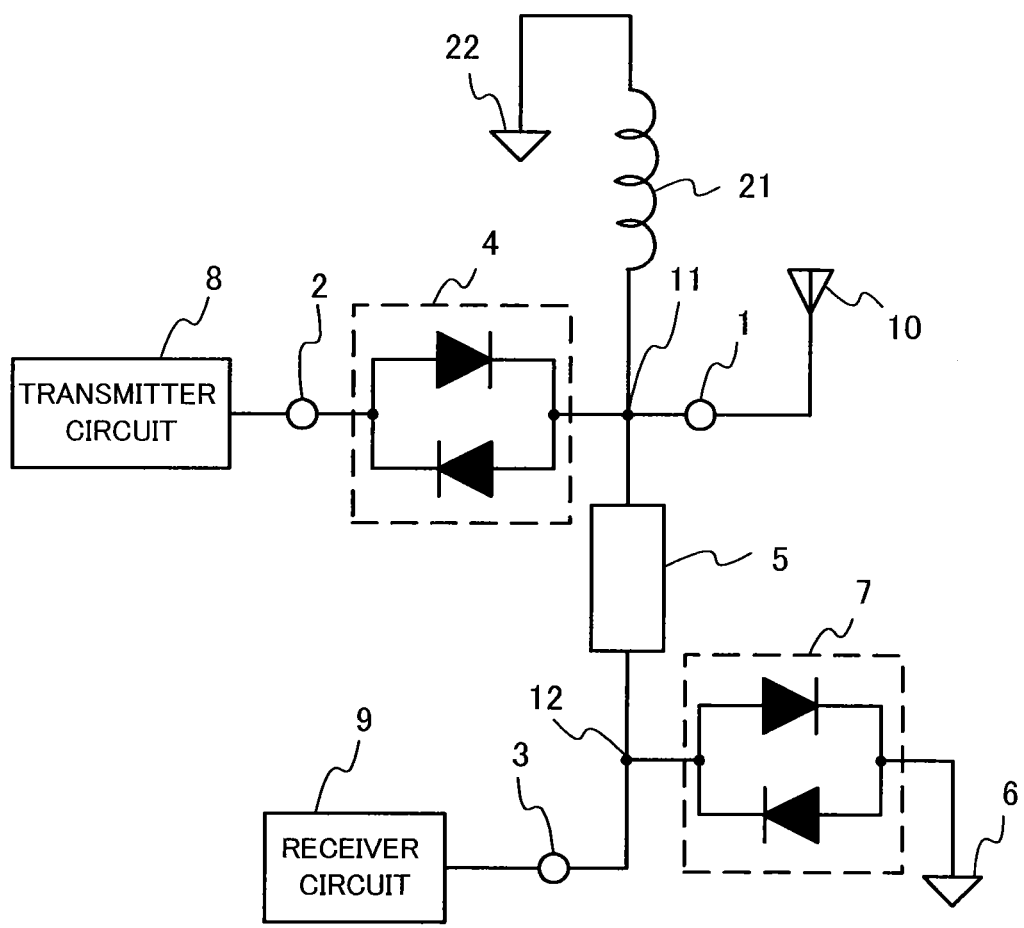
FIG. 10 is a circuit diagram illustrating a high frequency switch according to a sixth embodiment of the present invention.

A high frequency switch according to a sixth embodiment includes an inductance coupled between the first anti-parallel diode at the antenna-terminal-1 side coupled with the transmitting terminal 2 and the ground. FIG. 10 is a circuit diagram illustrating the high frequency switch according to the sixth embodiment of the present invention. In FIG. 10, the same component as that of FIG. 1 will be denoted by the same reference numeral.

As illustrated in FIG. 10, the high frequency switch of the sixth embodiment has an inductance 21 (second inductance) coupled between the anti-parallel diode 4 at the antenna-terminal-1 side and a ground 22. The ground 22 is an equipotential point that gives the same reference potential of the circuit as that of the ground 6. When power of a high frequency signal that is large-signal power from the transmitter circuit 8 decreases and becomes equal to or smaller than the forward voltage of the PIN diode like 100 mW, the anti-parallel diode 4 becomes an off state, and the antenna terminal 1 and the transmitting terminal 2 are disconnected. There is an advantage that a fall time which is a transition time to the disconnected state is reduced by providing the inductance 21. By coupling the inductance 21 between the anti-parallel diode 4 at the antenna-terminal-1 side and the ground 22, a high frequency switch that has a short fall time without needing a special control signal becomes obtainable.

The impedance of the inductance 21 can be regarded as a high resistor in the frequency of a high frequency signal, and thus a high frequency signal passing through the inductance 21 is ignorable.

Figure 11:
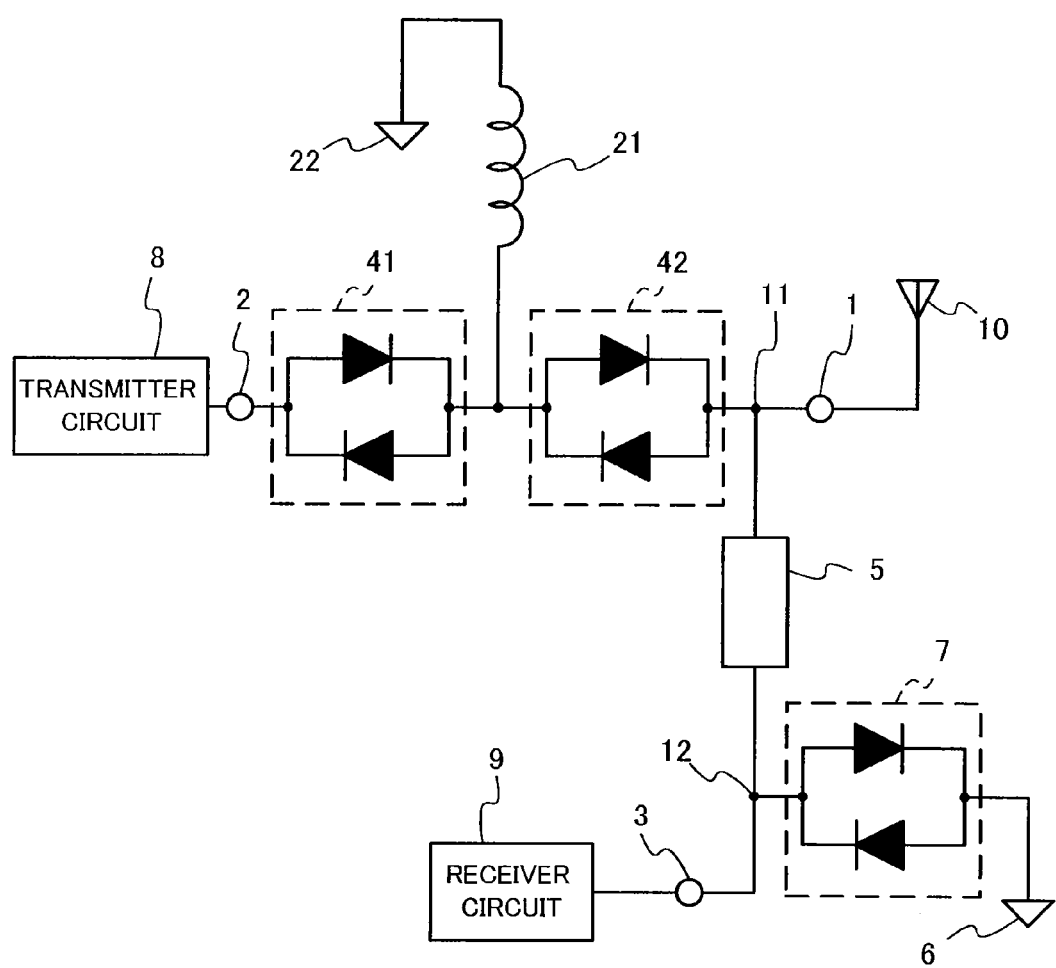
FIG. 11 is a circuit diagram illustrating the high frequency switch of the second embodiment employing the structure of the sixth embodiment.

When the inductance 21 according to the sixth embodiment of the present invention is applied to the high frequency switches of the second to fourth embodiments of the present invention, the similar advantage can be accomplished. FIG. 11 is a circuit diagram illustrating the high frequency switch of the second embodiment employing the structure of the sixth embodiment. The high frequency switch in FIG. 11 is the high frequency switch in FIG. 3 that has the inductance 21 coupled between the anti-parallel diode 41 at the antenna-terminal-1 side and the ground 22.

Figure 12:
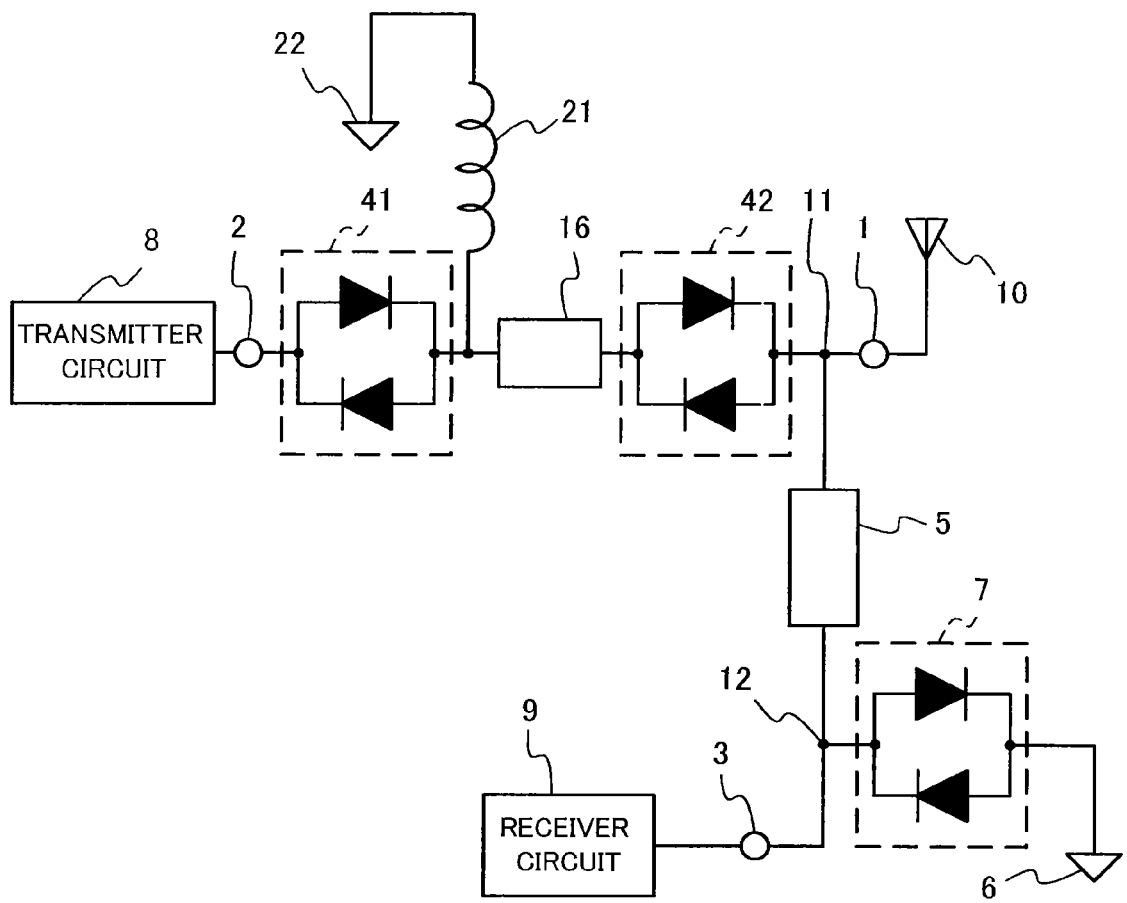
FIG. 12 is a circuit diagram illustrating the high frequency switch of the third embodiment employing the structure of the sixth embodiment.

FIG. 12 is a circuit diagram illustrating the high frequency switch of the third embodiment employing the structure of the sixth embodiment. The high frequency switch in FIG. 12 is the high frequency switch in FIG. 4 that has the inductance 21 coupled between the anti-parallel diode 41 at the antenna-terminal-1 side and the ground 22.

Figure 13:
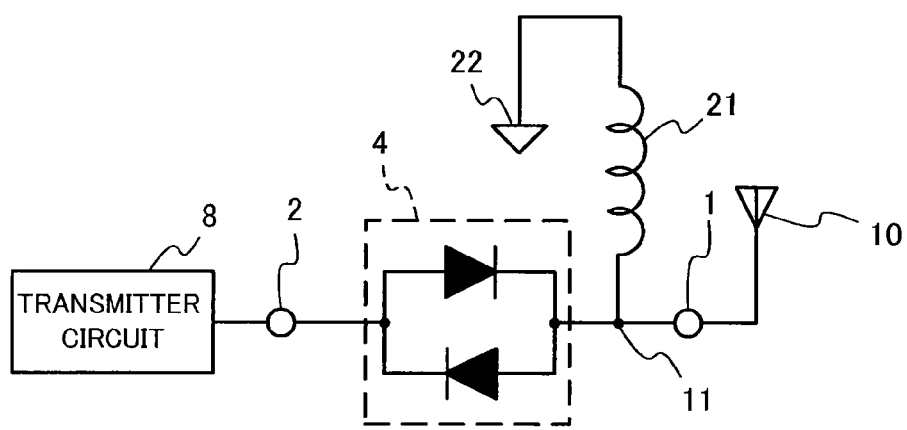
FIG. 13 is a circuit diagram illustrating the high frequency switch of the fourth embodiment employing the structure of the sixth embodiment.

FIG. 13 is a circuit diagram illustrating the high frequency switch of the fourth embodiment employing the structure of the sixth embodiment. The high frequency switch in FIG. 13 is the high frequency switch in FIG. 5 that has the inductance 21 coupled between the anti-parallel diode 4 at the antenna-terminal-1 side and the ground 22.

Figure 14:
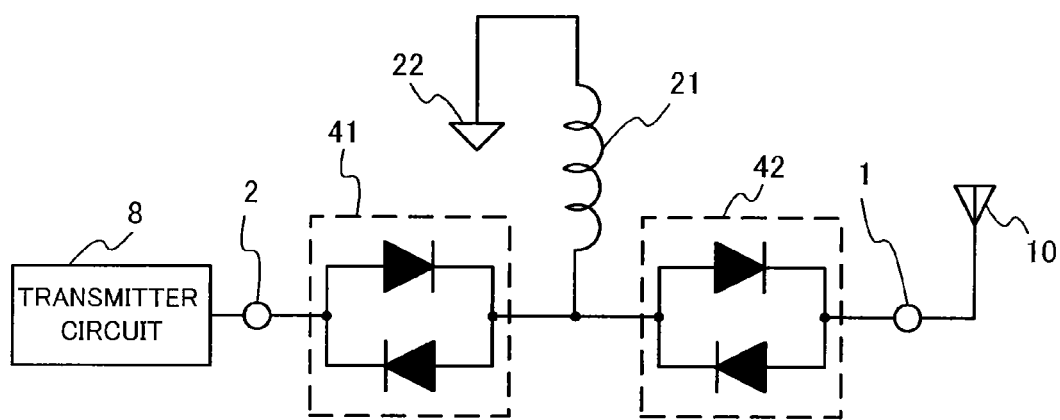
FIG. 14 is a circuit diagram illustrating another high frequency switch of the fourth embodiment employing the structure of the sixth embodiment.

FIG. 14 is a circuit diagram illustrating another high frequency switch of the fourth embodiment employing the structure of the sixth embodiment. The high frequency switch in FIG. 14 has the two anti-parallel diodes 4 of the fourth embodiment, and has the inductance 21 coupled between the anti-parallel diode 41 coupled with the transmitting terminal 2 at the antenna-terminal-1 side and the ground 22.

As illustrated in FIGS. 11, 12 and 14, when the anti-parallel diodes 4 are connected in series, the inductance 21 is provided at the common connection point of the series connection.

Seventh Embodiment

Figure 15:
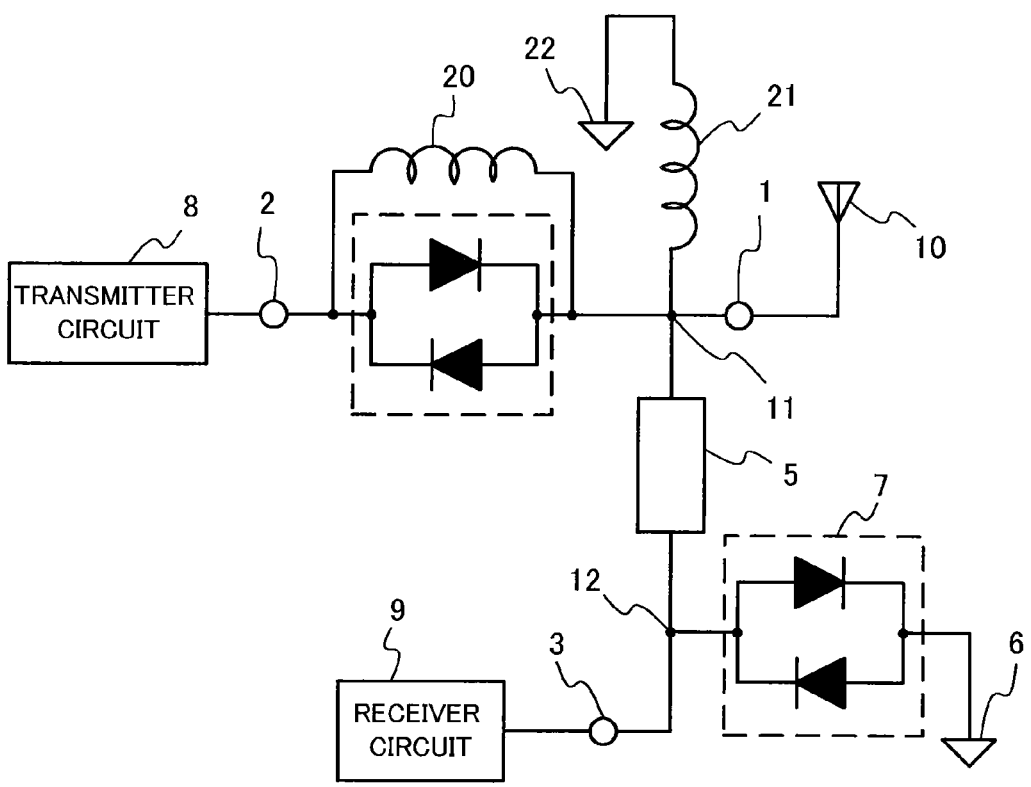
FIG. 15 is a circuit diagram illustrating a high frequency switch according to a seventh embodiment of the present invention.

A high frequency switch according to a seventh embodiment includes, in addition to the structure of the high frequency switch of the fifth embodiment, an inductance coupled between the anti-parallel diode 4 at the antenna-terminal-1 side and the ground 22. FIG. 15 is a circuit diagram illustrating the high frequency switch according to the seventh embodiment of the present invention. In FIG. 15, the same component as those of FIGS. 1, 6, and 10 will be denoted by the same reference numeral.

As illustrated in FIG. 15, the high frequency switch of the seventh embodiment has an inductance 20 connected in parallel with the anti-parallel diode 4, and also has the inductance 21 coupled between the anti-parallel diode 4 at the antenna-terminal-1 side and the ground 22. The high frequency switch of the seventh embodiment uses the inductance 20 and the inductance 21, and functions as both high frequency switches of the fifth embodiment and the sixth embodiment of the present invention. Hence, a high frequency switch that has a shorter fall time than those of the fifth and sixth embodiments is obtainable.

Figure 16:
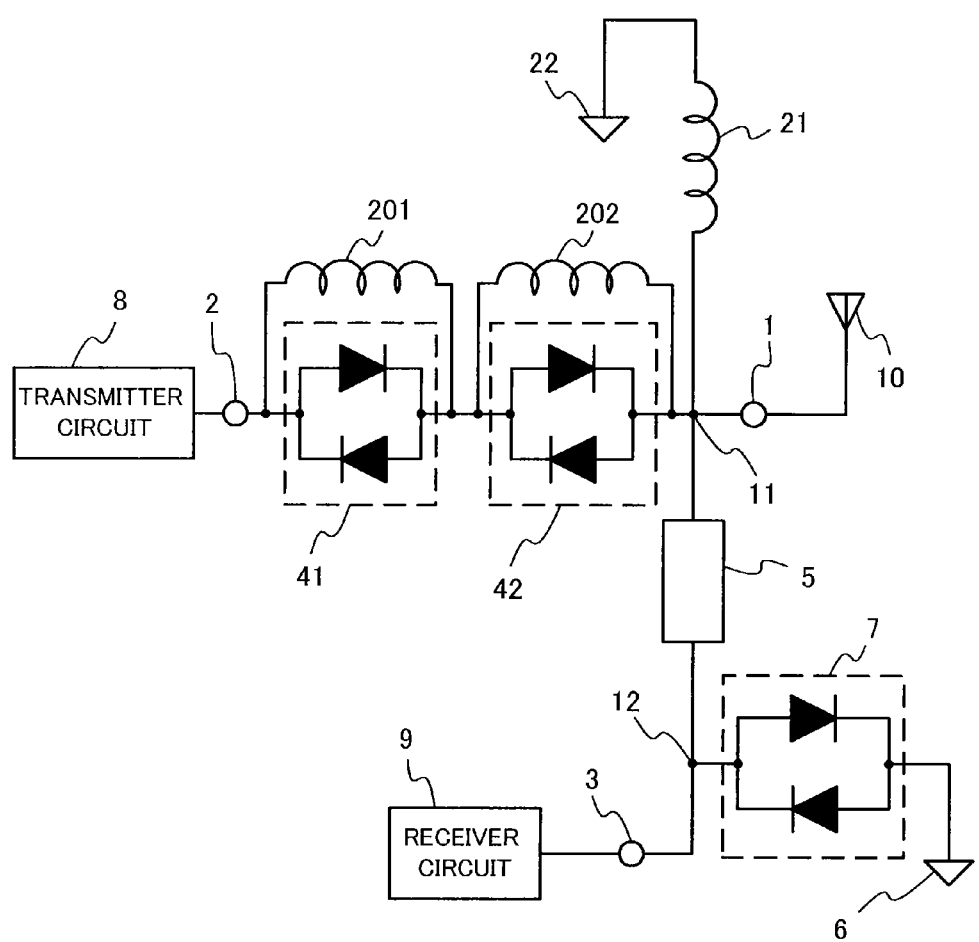
FIG. 16 is a circuit diagram illustrating the high frequency switch of the second embodiment employing the structure of the seventh embodiment.

When the inductance 20 and the inductance 21 of the seventh embodiment of the present invention are applied to the high frequency switches of the second to fourth embodiments of the present invention, the similar advantage can be accomplished. FIG. 16 is a circuit diagram illustrating the high frequency switch of the second embodiment employing the structure of the seventh embodiment. The high frequency switch in FIG. 16 is the high frequency switch in FIG. 7 that has the inductance 21 coupled between the anti-parallel diode 42 at the antenna-terminal-1 side and the ground 22.

Figure 17:
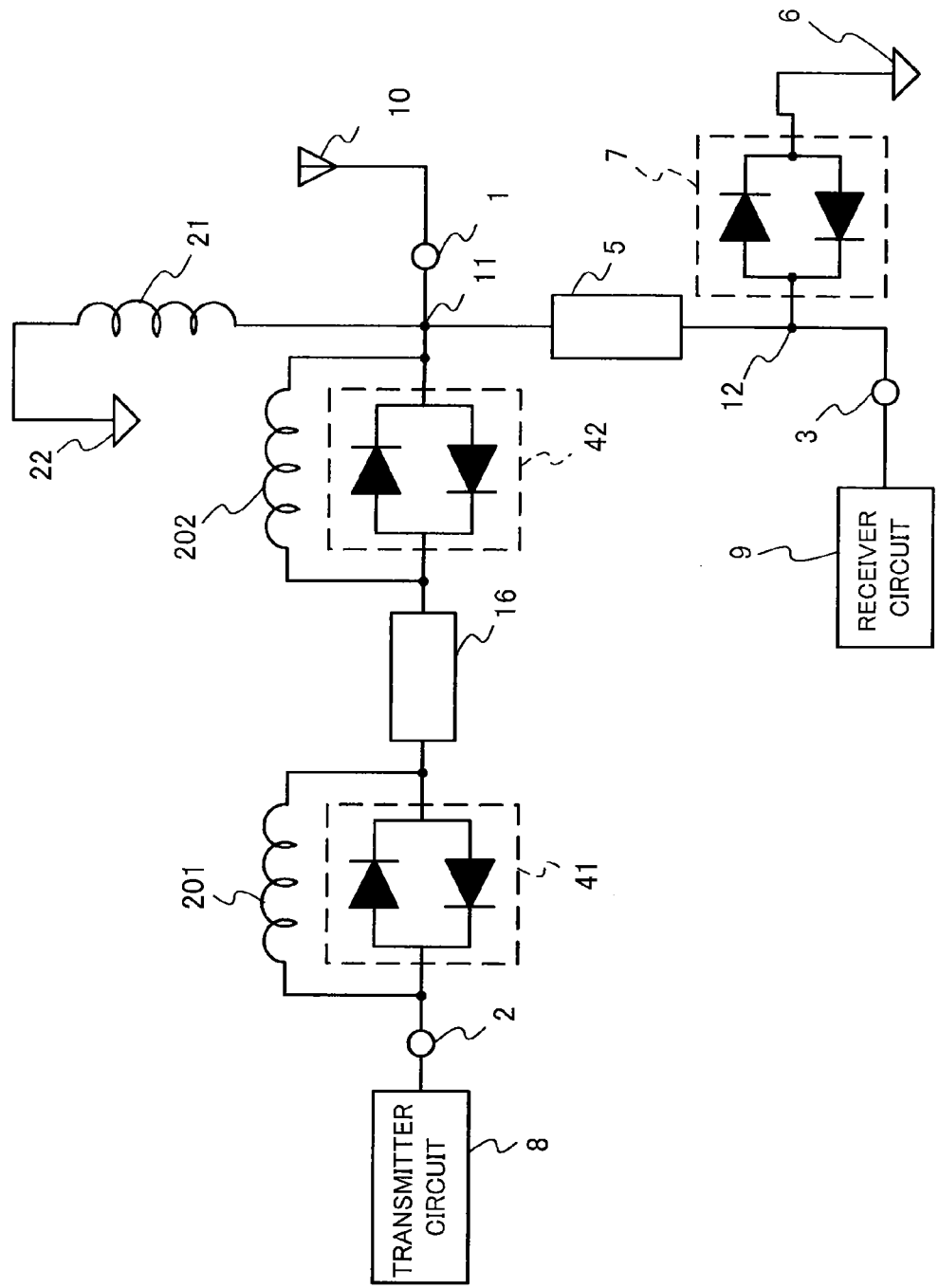
FIG. 17 is a circuit diagram illustrating the high frequency switch of the third embodiment employing the structure of the seventh embodiment.

FIG. 17 is a circuit diagram illustrating the high frequency switch of the third embodiment employing the structure of the seventh embodiment. The high frequency switch in FIG. 17 is the high frequency switch in FIG. 8 that has the inductance 21 coupled between the anti-parallel diode 42 at the antenna-terminal-1 side and the ground 22.

Figure 18:
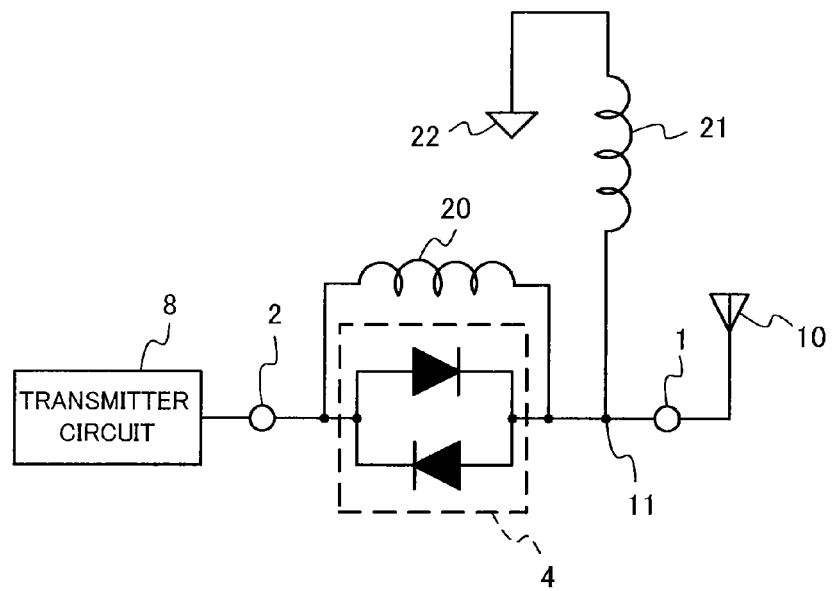
FIG. 18 is a circuit diagram illustrating the high frequency switch of the fourth embodiment employing the structure of the seventh embodiment.

FIG. 18 is a circuit diagram illustrating the high frequency switch of the fourth embodiment employing the structure of the seventh embodiment. The high frequency switch in FIG. 18 is the high frequency switch in FIG. 9 that has the inductance 21 coupled between the anti-parallel diode 4 at the antenna-terminal-1 side and the ground 22.

Figure 19:
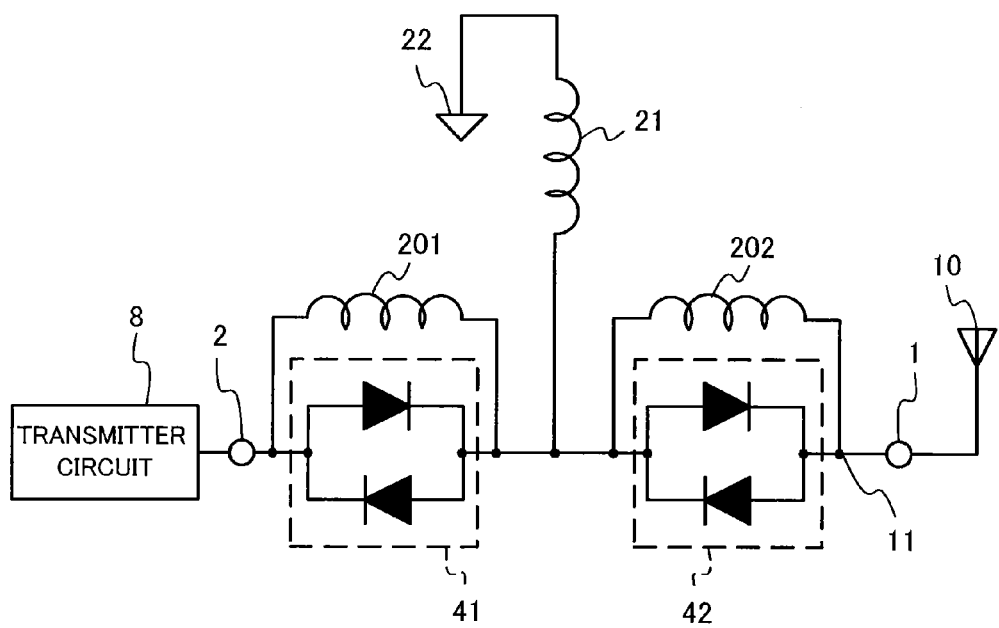
FIG. 19 is a circuit diagram illustrating another high frequency switch of the second embodiment employing the structure of the seventh embodiment.

FIG. 19 is a circuit diagram illustrating another high frequency switch of the fourth embodiment employing the structure of the seventh embodiment. The high frequency switch in FIG. 19 is the high frequency switch in FIG. 14 that has the inductance 21 coupled between the anti-parallel diode 41 at the antenna-terminal-1 side and the ground 22.

According to the seventh embodiment of the present invention, when equal to or greater than two anti-parallel diodes 4 are coupled in series, the inductance 21 may be provided at any of the common connection point of the anti-parallel diodes 4 connected in series, the antenna-terminal-1 side, and the transmitting-terminal-2 side.

The above-explained embodiments can be all changed in various forms within the scope and spirit of the present invention. The above-explained embodiments are to explain the present invention, and are not intended to limit the scope and spirit of the present invention. The scope and spirit of the present invention should be indicated by the appended claims rather than the embodiments. Various modifications within the scope and spirit of the present invention and within the equivalent range thereto should be also within the scope and spirit of the present invention.

This application claims the benefit of priority based on Japanese Patent Application No. 2011-119379 filed on May 27, 2011 and including the specification, the claims, the drawings and the abstract. The whole disclosure of this basic patent application is included in this specification by reference.

REFERENCE SIGNS LIST

1 Antenna terminal (first high-frequency-signal input/output terminal)
2 Transmitting terminal (second high-frequency-signal input/output terminal)
3 Receiving terminal (third high-frequency-signal input/output terminal)
4, 41, 42 Anti-parallel diode (first anti-parallel diode)
5 ¼-wavelength line (first ¼-wavelength line)
6 Ground
7, 71, 72 Anti-parallel diode (second anti-parallel diode)
8 Transmitter circuit
9 Receiver circuit
10 Antenna
11 Branched point
12 Connection point
13 Transmitting signal
14 Receiving signal
16 ¼-wavelength line (second ¼-wavelength line)
20 Inductance (first inductance)
21 Inductance (second inductance)
22 Ground
201, 202 Inductance (first inductance)

The invention claimed is:
1. A high frequency switch comprising;
a first anti-parallel diode which includes two or more anti-parallel diodes connected in series, one end of the first anti-parallel diode being coupled with a first high-frequency-signal input/output terminal, another end of the first anti-parallel diode being coupled with a second high-frequency-signal input/output terminal, and the first anti-parallel diode becoming a conduction state when input power of equal to or greater than a predetermined high frequency power is input;
a first inductance that is coupled in parallel with the first anti-parallel diode; and
a second inductance coupled between any terminal of the two or more anti-parallel diodes of the first anti-parallel diode and a ground.
2. The high frequency switch according to claim 1, further comprising a ¼-wavelength line in a use frequency of the high frequency switch, the ¼-wavelength line including one end coupled with the first high-frequency-signal input/output terminal and another end coupled with a third high-frequency-signal input/output terminal.

3. A high frequency switch comprising;
a first anti-parallel diode which includes two or more anti-parallel diodes connected in series, one end of the first anti-parallel diode being coupled with a first high-frequency-signal input/output terminal, another end of the first anti-parallel diode being coupled with a second high-frequency-signal input/output terminal, and the first anti-parallel diode becoming a conduction state when input power of equal to or greater than a predetermined high frequency power is input;
a first ¼-wavelength line in a use frequency of the high frequency switch, the first ¼-wavelength line being coupled in series between two of the two or more anti-parallel diodes of the first anti-parallel diode;
a first inductance coupled in parallel with the first anti-parallel diode; and
a second inductance coupled between any terminal of the two or more anti-parallel diodes of the first anti-parallel diode and a ground.

4. The high frequency switch according to claim 3, further comprising a second ¼-wavelength line in the use frequency of the high frequency switch, the second ¼-wavelength line including one end coupled with the first high-frequency-signal input/output terminal and another end coupled with a third high-frequency-signal input/output terminal.

5. A high frequency switch comprising:
a first anti-parallel diode which includes two or more anti-parallel diodes connected in series, one end of the first anti-parallel diode being coupled with a first high-frequency-signal input/output terminal, another end of the first anti-parallel diode being coupled with a second high-frequency-signal input/output terminal, and the first anti-parallel diode becoming a conduction state when input power of equal to or greater than a predetermined high frequency power is input;
a first ¼-wavelength line in a use frequency of the high frequency switch, the first ¼-wavelength line including one end coupled with the first high-frequency-signal input/output terminal and another end coupled with a third high-frequency-signal input/output terminal;
a second anti-parallel diode which is coupled between the third high-frequency-signal input/output terminal and a ground, the second anti-parallel diode becoming a conduction state when input power of equal to or greater than predetermined high frequency power is input;
a first inductance that is coupled in parallel with the first anti-parallel diode; and
a second inductance coupled between any terminal of the two or more anti-parallel diodes of the first anti-parallel diode and the ground.

6. A high frequency switch comprising:
a first anti-parallel diode which includes two or more anti-parallel diodes connected in series, one end of the first anti-parallel diode being coupled with a first high-frequency-signal input/output terminal, another end of the first anti-parallel diode being coupled with a second high-frequency-signal input/output terminal, and the first anti-parallel diode becoming a conduction state when input power of equal to or greater than a predetermined high frequency power is input;
a first ¼-wavelength line in a use frequency of the high frequency switch, the first ¼-wavelength line including one end coupled with the first high-frequency-signal input/output terminal and another end coupled with a third high-frequency-signal input/output terminal;
a second anti-parallel diode which is coupled between the third high-frequency-signal input/output terminal and a ground, the second anti-parallel diode becoming a conduction state when input power of equal to or greater than predetermined high frequency power is input; and
a second ¼-wavelength line in the use frequency of the high frequency switch, the second ¼-wavelength line being coupled in series between two of the two or more anti-parallel diodes of the first anti-parallel diode.

7. The high frequency switch according to claim 6, further comprising an inductance coupled between the first anti-parallel diode coupled with the second high-frequency-signal input/output terminal at the first high-frequency-signal-input/output-terminal side and the ground.

8. A high frequency switch, comprising:
a first anti-parallel diode which includes two or more anti-parallel diodes connected in series, one end of the first anti-parallel diode being coupled with a first high-frequency-signal input/output terminal, another end of the first anti-parallel diode being coupled with a second high-frequency-signal input/output terminal, and the first anti-parallel diode becoming a conduction state when input power of equal to or greater than a predetermined high frequency power is input;
a first ¼-wavelength line in a use frequency of the high frequency switch which includes one end coupled with the first high-frequency-signal input/output terminal and another end coupled with a third high-frequency-signal input/output terminal;
a second anti-parallel diode which is coupled between the third high-frequency-signal input/output terminal and a ground, the second anti-parallel diode becoming a conduction state when input power of equal to or greater than predetermined high frequency power is input;
a first inductance coupled in parallel with the first anti-parallel diode; and
a second inductance coupled between any terminal of the two or more anti-parallel diodes of the first anti-parallel diode and a ground.

9. A high frequency switch comprising;
a first anti-parallel diode which includes one end coupled with a first high-frequency-signal input/output terminal and another end coupled with a second high-frequency-signal input/output terminal, the first anti-parallel diode becoming a conduction state when input power of equal to or greater than a predetermined high frequency power is input;
a first inductance coupled between the first anti-parallel diode coupled with the second high-frequency-signal input/output terminal at the first high-frequency-signal-input/output-terminal side and a ground; and
a second inductance coupled in parallel with the first anti-parallel diode.

10. The high frequency switch according to claim 9, further comprising a ¼-wavelength line in a use frequency of the high frequency switch, the ¼-wavelength line including one end coupled with the first high-frequency-signal input/output terminal and another end coupled with a third high-frequency-signal input/output terminal.

11. The high frequency switch according to claim 10, further comprising a second anti-parallel diode which is coupled between the third high-frequency-signal input/output terminal and a ground, the second anti-parallel diode becoming a conduction state when input power of equal to or greater than predetermined high frequency power is input.

12. The high frequency switch according to claim 9, wherein
the first anti-parallel diode comprises two or more anti-parallel diodes connected in series, and
the high frequency switch further comprises a ¼-wavelength line in a use frequency of the high frequency switch, the ¼-wavelength line being coupled in series between two of the two or more anti-parallel diodes of the first anti-parallel diode.

* * * * *